United States Patent [19]

Matsushita et al.

[11] Patent Number: 4,862,233

[45] Date of Patent: Aug. 29, 1989

[54] INTEGRATED CIRCUIT DEVICE HAVING VERTICAL MOS PROVIDED WITH ZENER DIODE

[75] Inventors: Tsutomu Matsushita, Yokohama; Teruyoshi Mihara, Yokosuka, both of Japan

[73] Assignee: Nissan Motor Company Limited, Yokohama, Japan

[21] Appl. No.: 63,116

[22] Filed: Jun. 17, 1987

[30] Foreign Application Priority Data

Jun. 18, 1986 [JP] Japan ................... 61-140320

[51] Int. Cl.⁴ .............................. H01L 29/78
[52] U.S. Cl. .................... 357/23.4; 357/52; 357/13; 357/42
[58] Field of Search ............. 357/23.4, 23.8, 23.13, 357/13, 41, 42, 48, 51, 52, 86

[56] References Cited

U.S. PATENT DOCUMENTS

| | | | |
|---|---|---|---|
| 3,590,345 | 6/1971 | Brewer | 357/86 |
| 3,878,551 | 4/1975 | Callahan, Jr. | 357/48 |
| 4,546,370 | 10/1985 | Curran | 357/23.4 |
| 4,567,502 | 1/1986 | Nakagawa et al. | 357/52 |
| 4,593,302 | 6/1986 | Lidow et al. | 357/23.4 |
| 4,622,568 | 11/1986 | Schutten et al. | 357/52 |
| 4,639,754 | 1/1987 | Wheatley, Jr. et al. | 357/23.4 |
| 4,646,117 | 2/1987 | Temple | 357/86 |
| 4,658,203 | 4/1987 | Freymuth | 357/23.13 |
| 4,686,551 | 8/1987 | Mihara | 357/13 |

FOREIGN PATENT DOCUMENTS

| | | | |
|---|---|---|---|
| 0071916 | 2/1983 | European Pat. Off. | 357/23.4 |
| 61-80860 | 4/1986 | Japan | 357/23.4 |

OTHER PUBLICATIONS

Kyomasu et al., "Analysis of Latch-Up in CMOS IC," Denshi Tsushin Gakkai Ronbunshi, '78/2, vol. J61-CN02, pp. 106-113.

ISSCC 86/Weds., 2/19/86, International Solid-State Circuits Conference, Einzinger et al., pp. 22-23 and 289, (Session I, Analog Techniques).

IEEE, Power Electronics Specialists Conference Record, '85, The Design of a High Power Solid State Automotive Switch in CMOS-VDMOS Technology, Wrathall, 229-233.

Primary Examiner—Andrew J. James
Assistant Examiner—Mark Prenty
Attorney, Agent, or Firm—Foley & Lardner, Schwartz, Jeffrey, Schwaab, Mack, Blumenthal & Evans

[57] ABSTRACT

Vertical MOS and another component such as CMOS are made in a single semiconductor substrate having a highly doped underlying layer and a lightly doped epitaxial surface layer of a first conductivity type. The vertical MOS includes a channel region of a second conductivity type, formed in the surface layer, and a source region of the first conductivity type, formed in the channel region. The channel region is made deep and joined with the highly doped underlying layer to form a first Zener diode for regulating a drain-source voltage. A drain electrode is formed on the bottom surface of the substrate and connected to a power supply, and a topside source electrode is connected to a load. The vertical MOS is surrounded, and separated from the CMOS, by a grounded guard ring region of the second conductivity type, formed in the surface layer. The guard ring region is also made deep and joined with the underlying layer.

15 Claims, 13 Drawing Sheets

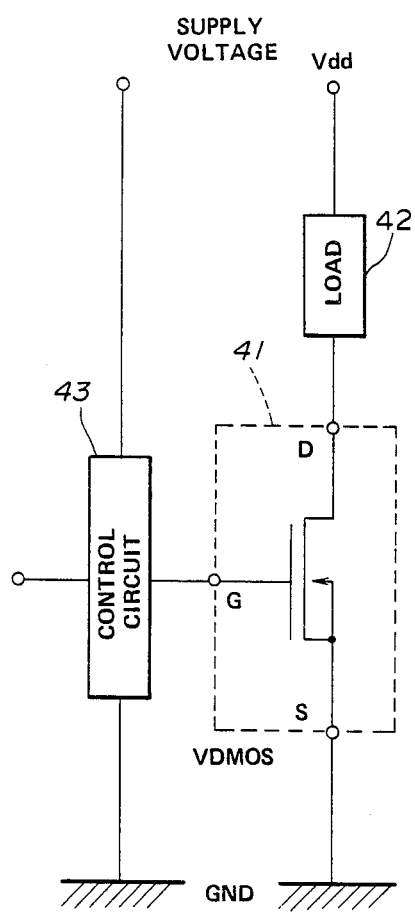
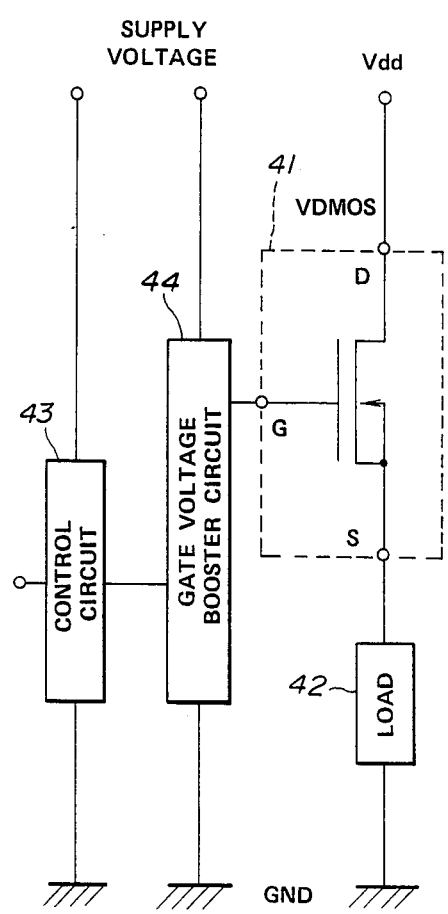
FIG.10A
(PRIOR ART)
FIG.10B
(PRIOR ART)

INTEGRATED CIRCUIT DEVICE HAVING VERTICAL MOS PROVIDED WITH ZENER DIODE

BACKGROUND OF THE INVENTION

The present invention relates to a semiconductor device in which a power vertical DMOS (VDMOS) transistor and associated components are formed in a single semiconductor chip, and which is suitable for relatively low voltage and high current application and easy to fabricate.

Recently, there are proposed an integrated circuit semiconductor device (so-called power IC) in which a power VDMOS used as a switching element for various loads mounted on a vehicle, and other circuit elements constituting its drive circuit are monolithically formed in a single chip.

First, reference is made to a conventional example of a VDMOS device shown in FIG. 9. A VDMOS 41 shown in FIG. 9 is a n-channel type. An Si substrate 1 of this device is a so-called epitaxial substrate consisting of an $n^{30}$ underlying layer 2 and an n epitaxial surface layer 3. The device further comprises a p channel region 4, an n+source 5, a gate insulating oxide layer 6, a polycrystalline silicon gate electrode 7, a p+channel contact region 8, a source electrode 9, an intermediate insulating layer 11, and a drain electrode 12. A final protective film (not shown) of PSG or the like is formed on the source electrode 9. The p+channel contact region 8 is not always indispensable, but it is helpful for reliably making the potential of the p channel region 4 equal to the potential of the n+source region 5.

In this VDMOS, a channel is formed in an upper portion 4a of the channel region 4 immediately below the gate electrode 7, and the n-type epitaxial surface layer 3 practically serves as a drain region of the VDMOS 41. The conductivity of the channel formed in the portion 4a is controlled by a voltage applied between the gate and source, and accordingly, the current flowing between the source and drain is controlled.

The VDMOS has the following advantages in addition to advantages of standard MOS transistors. The on resistance of the VDMOS is low, and it is easy to increase the withstand voltage and current capacity of the VDMOS. Furthermore, the VDMOS is uncostly because it can be fabricated without need for any special process. Therefore, the VDMOS transistors are becoming a mainstream of the power MOS transistors.

There are two different VDMOS circuits, an open drain connection shown in FIG. 10A, and a source follower connection shown in FIG. 10B.

In the open drain connection shown in FIG. 10A, a load 42 is connected between the drain terminal D of the VDMOS 41 and a supply voltage Vdd, and the source terminal S is connected to a ground. The gate terminal G of the VDMOS 41 receives an output voltage of a control circuit 43. In this configuration, the output voltage of the control circuit 43 which is applied to the gate terminal is always equal to a voltage between the gate and source of the VDMOS 41. Therefore, it is possible to control the current flowing through the load 42 by varying the output voltage of the control circuit 43 from the ground potential to the supply voltage Vdd. This configuration does not require a complicated circuit.

In the source follower connection shown in FIG. 10B, the load 42 is connected between the source terminal S of the VDMOS 41 and the ground (GND), and the drain terminal D is connected to the supply voltage Vdd. In this configuration, the potential of the source terminal S closely approaches to the supply voltage Vdd during the on period of the VDMOS, 41. Therefore, it is necessary to make the voltage of the gate terminal G higher than the supply voltage Vdd in order to ensure a sufficient gate-source voltage. For this reason, the source follower configuration requires a gate voltage booster circuit 44 between the control circuit 43 and the gate terminal G, for assisting the control circuit 43 which, in general, cannot increase the output voltage beyond the supply voltage Vdd.

For example, the gate voltage booster circuit 44 may take the form of a charge pump type booster circuit comprising an oscillator, condenser, and diode in combination.

The source follower configuration is disadvantageous in that it requires a complicated peripheral circuit, as explained above. However, this configuration is advantageous in that, when it is used for controlling a load mounted on a vehicle, the wiring can be simplified by using the vehicle body as a ground.

It is possible to integrate the VDMOS 41 and is peripheral circuit such as the control circuit 43 and the booster circuit 44 into a monolithic power IC. Such an integration makes it possible to reduce the size of the device, to reduce the packaging cost, to attain cost reduction and improvement of performance by omitting leads between components, and to develop new functions.

In the power IC, however, electrical isolation is problematical. Although isolation is not always required in the source follower configuration in which the potential of the substrate is fixed at the supply voltage, yet isolation between the VDMOS 41 and other integrated components is essential when the VDMOS 41 is used in the open drain configuration. In the open drain configuration, the potential of the substrate which is used as a drain region of the VDMOS 41 varies widely from the ground potential to the supply voltage Vdd.

The most common isolation technique is junction isolation using reverse-biased pn junctions. For example, it is possible to separate components from a VDMOS by forming them in a p-type well which is formed in the n-type surface layer 3 of FIG. 9 and which is connected to a ground to reverse-bias the pn junction between the p well and the n surface layer. Such a simple structure, however, is limited in application because it is not possible to form a complicated CMOS or a bipolar transistor in the p well.

A conventional integrated circuit device shown in FIG. 11 (R.S. Wrathall, "The Design of a High Power Solid State Automotive Switch in CMOS-VDMOS Technology", IEEE, Power Electronics Specialists Conference Record '85, P229-233) achieves isolation by using a three-layer substrate 45, an isolation diffusion wall 51 and an n-type buried layer 52. The npn three-layer substrate 45 is formed by forming a p-type intermediate layer 47 and an n-type top layer 48 on an n-type original substrate by two different epitaxial growths. The p isolation diffusion wall 51 reaching the p intermediate layer 47 is formed around a VDMOS 49.

The n buried layer 52 is formed under the n-type drain region of the VDMOS 49 so that the drain region is connected with the n bottom layer 46. In this way, an nMOS 53, a pMOS 54, a bipolar transistor 55 and other circuit elements are separated from the VDMOS 49 and the n bottom layer 46 by the p layer 47 and the p wall 51, so that electrical isolation can be achieved by connecting the p layer 47 and the p wall 51 to the ground. This conventional structure is applicable to both of the open drain configuration and the source follower configuration. This conventional structure can increase the flexibility in designing various transistors 53–55 formed in the n top layer 48 because the impurity concentration of the n top epitaxial layer 48 can be controlled independent of the concentration of the n bottom layer 46.

In the conventional device of FIG. 11, however, costly epitaxial growth is required twice, and moreover, the n buried layer 52 must be formed between the steps of epitaxial growth. Furthermore, a long heat treatment is required in order to diffuse the isolation diffusion wall 51 to the layer 47. Therefore, the conventional device of FIG. 11 is disadvantageous in that the fabrication process is complicated, time-consuming and costly.

Another conventional example is shown in FIG. 12. An integrated circuit device of FIG. 12 uses a lateral DMOS transistor (LDMOS) 56 in which an n+drain contact region is formed in the surface of n-type drain region, and a drain electrode is formed on the top side rather than on the bottom side. It is easy to increase the withstand voltage of an LDMOS as in a VDMOS, but the on resistance of the LDMOS is two or more times as high as that of the VDMOS.

In the device of FIG. 12, isolation is relatively easy because the substrate is not used as a drain. This device separates the LDMOS 56 from nMOS 53, pMOS 54, bipolar transistors 55 and 59 and junction FET 60 by using a p-type substrate 57 and forming p-type isolation diffusion walls 51 in an n surface layer 58.

The structure of FIG. 12 is basically similar to that of a bipolar IC, so that the integration of the DMOS 56 and other circuit components is relatively easy, and the flexibility of IC design is high. However, the device of FIG. 12 is not suitable for high current application because the high on resistance of the LDMOS 56 incurs increase of the device's area and increase of the fabrication cost.

FIG. 13 shows a third conventional example of a power IC (as disclosed in ISSCC'86, Digest of Technical Papers, pages 22–23). The device of FIG. 13 is designed to employ the source follower configuration.

In the first and second conventional examples shown in FIGS. 11 and 12, isolation is required because they are designed to employ the open drain configuration. Unlike the first and second examples, the third example of FIG. 13 does not require isolation because its power MOS transistor is used only in the source follower configuration. However, the source follower configuration requires the gate voltage booster circuit 44 as shown in FIG. 10B. This requirement is not so disadvantageous if it is possible to integrate the booster circuit 44, the control circuit 43 and the VDMOS into a monolithic power IC. In the third example of FIG. 13, the VDMOS 41 and a CMOS 61 are formed in a single substrate. The CMOS 61 includes an nMOS formed in a p island formed in an n surface layer 3 of the substrate, and a pMOS formed directly in the n surface layer 3. The nMOS comprises an n+ounce region 28, an n+drain region 29, and a gate electrode 32. The pMOS comprises a p+source region 35, a p+drain region 36 and a gate electrode 37. The potential of the substrate 1 is fixed at the supply voltage because the VDMOS 41 is used in the source follower configuration. Therefore, the VDMOS 41 and the CMOS 61 can be operated independently.

However, such a simple structure of the third conventional example cannot reliably prevent interference between the VDMOS 41 and the CMOS 51 in a dynamic and transient state, so that this device is liable to cause malfunction as illustrated in FIGS. 14–16.

In an example shown in FIG. 14, power ICs are used for driving a DC motor M. When a power IC 62 and a MOS transistor 65 are on, and a power IC 63 and a MOS transistor 64 are off, then a current flows in direction shown by arrows $I_1$ and $I_2$ of FIG. 14, and the DC motor M is driven.

If the MOS transistor 65 is turned off at some instant, a so-called flywheel current continues flowing in a direction of $I_3$ for a while after that instant. This current $I_3$ flows into the source electrode of the VDMOS 41 of the power IC 63. In this case, if the device of FIG. 13 is used as the power ICs, holes 66 are injected from the source electrode 9 into the n surface layer 3 by the way of the p+channel contact region 8 and the p channel region 4, as shown in FIG. 15, and the holes 66 tend to cause a latch-up of the CMOS 61 in the following manner.

A part of the injected holes 66 reach the p well 27 by diffusing in the n surface layer 3, and flow out through a p+-type well contact region 67 and a grounded terminal. When the holes 66 flow through a base resistance 69 of a parasitic npn transistor 68 which is formed in the p well 27, the base potential of the parasitic npn transistor 68 is increased beyond the ground potential while on the other hand the potential of the n+source region 28 is held at the ground potential. Therefore, the parasitic npn transistor 68 is turned on when an increase of this base potential becomes equal to or higher than a predetermined level (0.6 V). In the on state of the transistor 68, electrons are injected from the ground terminal GND into the n surface layer 3 by way of the n+source region 28 and the p well 27. The injected electrons flow through the n surface layer 3 and an n+substrate contact region 71, and flow out through the terminal connected to the supply voltage Vdd.

In this case, the electrons flow through a base resistance 73 of a parasitic pnp transistor 72 which is formed in the n surface layer 3. By so doing, the electrons decrease the base potential of the parasitic pnp transistor 72, so that the transistor 72 is also turned on.

The parasitic transistor 72 in the on state allows holes to flow from the power supply terminal into the p well 27 by way of the p+source region 35 and the n surface layer 3. In this way, the CMOS 61 falls into a latch-up state in which the two parasitic transistors 68 and 72 provide positive feedback to each other so that the current is increased and a short circuit is formed between the power supply terminal and the ground terminal. The latch-up persists until the power supply is switched off.

Such a latch-up of the CMOS is serious especially in the power IC of FIG. 13. First, the VDMOS 41 of the power IC permits the current density several times higher than that of an output transistor (lateral MOSFET) of a standard CMOSIC. Therefore, the density of the current flowing into the p+channel contact region 8 can become high, and the concentration of the holes injected into the n surface layer 3 can easily become high. For this reason, latch-up is more easily caused in the integrated CMOS of FIG. 13. Secondly, although the standard CMOSIC allows us to limit a surge current by inserting a resistance in series with the output and increasing an output impedance, yet such a measure is not possible in the power IC because the on resistance is increased too much.

SUMMARY OF THE INVENTION

It is an object of the present invention to provide an integrated circuit device which is advantageous in that it requires no complicated and costly process for isolating a vertical MOS transistor and other integrated circuit components, in that it facilitates fabrication of a complicated CMOS in the same substrate, in that it can prevent latch-up of a CMOS reliably even if the CMOS is combined with a vertical DMOS of a large current capacity in a single substrate, and in that it can decrease the on resistance of the vertical MOS.

BRIEF DESCRIPTION OF THE DRAWINGS

FIGS. 10A and 10B are circuit diagrams showing two different connections for driving a load by using the vertical MOS transistor of FIG. 9.

DETAILED DESCRIPTION OF THE INVENTION

Figure 1:
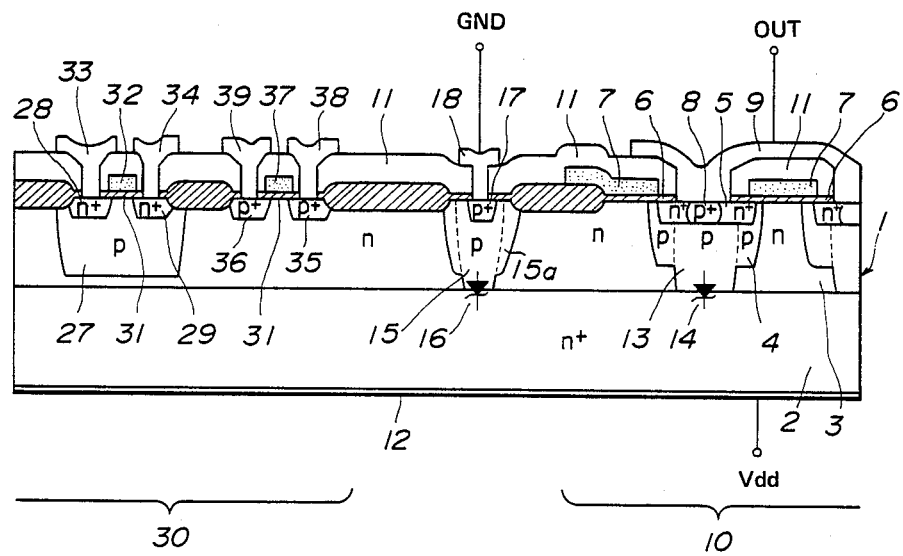
FIG. 1 is a vertical section showing a semiconductor device of a first embodiment according to the present invention.
Figure 2:
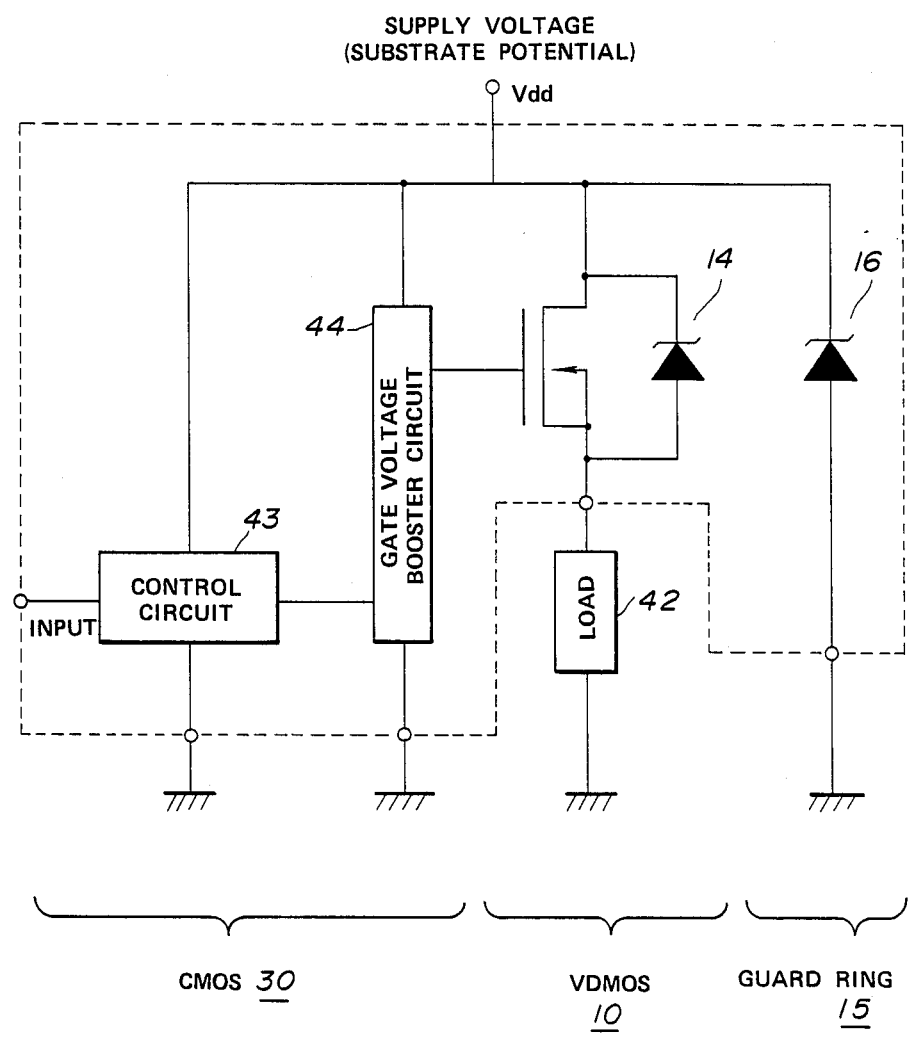
FIG. 2 is a diagram showing an equivalent circuit of the device of the first embodiment, arranged to drive a load.

A first embodiment of the present invention is shown in FIGS. 1 and 2.

An integrated circuit semiconductor device shown in FIG. 1 includes an epitaxial Si substrate 1 having an n+-type semiconductor underlying layer (original substrate) 2, and an n-type semiconductor top surface layer 3 formed on the underlying layer 2 by epitaxial growth. In this embodiment, at least one VDMOS device 10 and at least one CMOS (complementary metal oxide semiconductor) device 30 are formed monolithically in the epitaxial substrate 1.

The VDMOS 10 is formed by a p-type semiconductor channel region 4 formed in the epitaxial surface layer 3 of the substrate 1, and an n+-type semiconductor source region 5 formed in the channel region 4. A polycrystalline silicon gate electrode 7 is formed above the channel region 4, and the gate electrode 7 is isolated from the channel region 4 by a gate insulating oxide layer 6. The channel region 4 and source region 5 can be formed by introducing impurities into the epitaxial surface layer 3 of the substrate 1 by using, as a mask, the polycrystalline silicon gate electrode 7 preliminarily formed on the gate oxide layer 6.

There is further formed a p+-type semiconductor channel contact region 8, which is surrounded by the source region 5 and in contact with a source electrode 9. The source electrode 9 is separated from the gate electrode 7 by an intermediate insulating layer 11. A drain electrode 12 is formed on the bottom surface of the underlying layer 2 of the substrate 1.

The CMOS 30 is a pair of a pMOS formed directly in the n-type surface layer 3 of the substrate 1, and an nMOS formed in a p-type island (or pot) 27 formed in the surface layer 3. The nMOS is composed of an n+source region 28, and an n+drain region 29 which are both formed in the p island 27. The nMOS further includes a gate electrode 32 insulated from the semiconductor surface by a gate insulating oxide layer 31, a source electrode 33, and a drain electrode 34. The pMOS is composed of a p+source region 35 and a p+drain region 36 which are both in the n-type surface layer 3. The pMOS further includes a gate electrode 37 insulated by the gate insulating layer 31, a source electrode 38 and a drain electrode 39.

Figure 9:
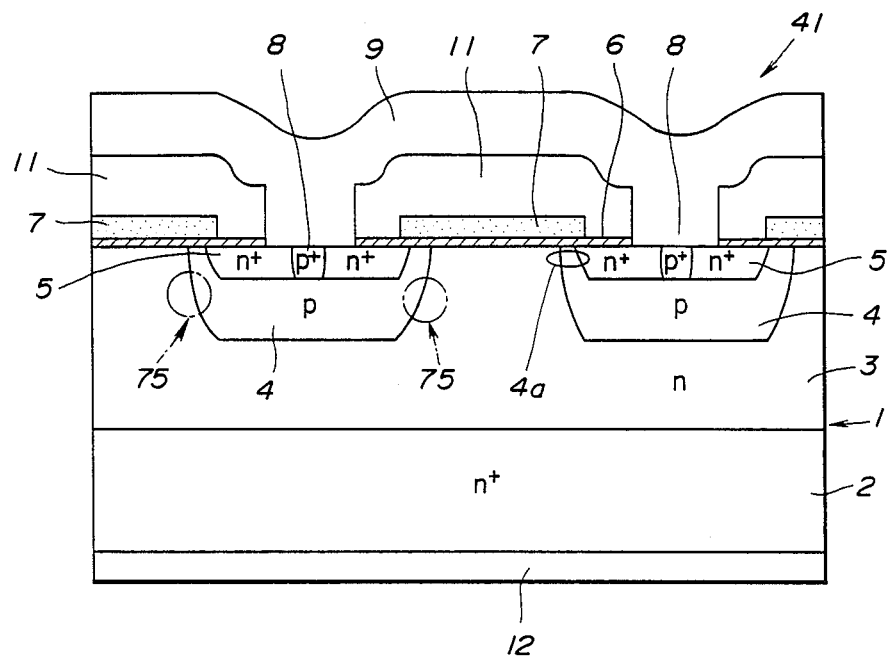
FIG. 9 is a vertical section showing a vertical MOS transistor of a conventional semiconductor device.
Figure 11:
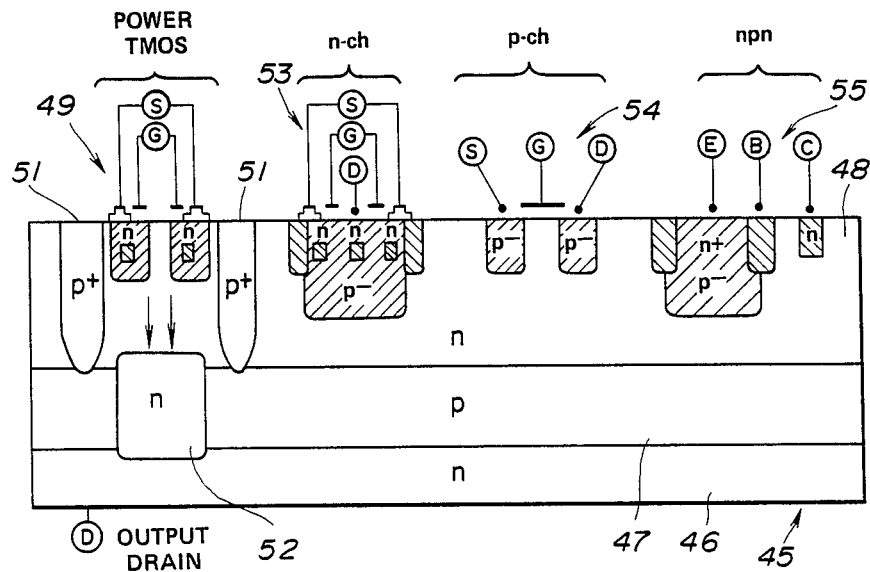
FIG. 11 is a vertical section showing an integrated circuit device of a conventional type.
Figure 12:
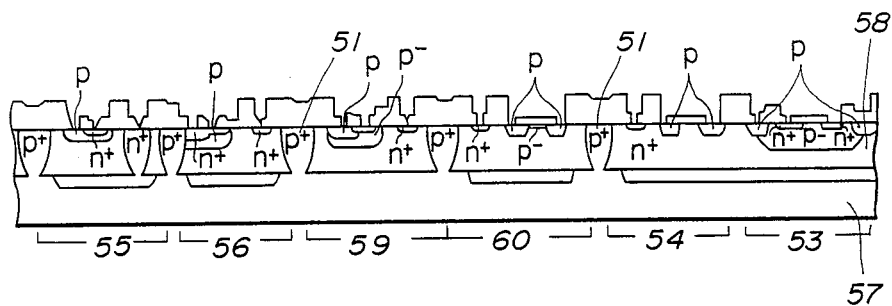
FIG. 12 is a vertical section showing an integrated circuit device of another conventional type.

The epitaxial surface layer 3 of this embodiment is made slightly thinner than that of the conventional device shown in FIG. 9. In the VDMOS 10 of this embodiment, a p-type Zener region 13 is formed in the p-type channel region 4. The p-type Zener region 13 is deep, and reaches the n+-type underlying layer 2 of the substrate 1. A pn junction between the p-type Zener region 13 and the n+underlying layer 2 forms a Zener diode 14 for regulating a breakdown voltage between drain and source of the VDMOS 10.

In this embodiment, the p-type Zener region 13 is formed separately in the p-type channel region 4 from the following reason. A surface impurity concentration of the p-type channel region 4 is an important factor determining a threshold voltage of the VDMOS 10. Therefore, it would be difficult to control the threshold voltage and a Zener voltage independent of each other if the Zener diode 14 were formed directly by the p-type channel region 4. The distinct Zener region 13 makes it possible to determine the threshold voltage and the Zener voltage independent of each other. In this embodiment, the Zener voltage is made lower than the source-drain breakdown voltage of the VDMOS 10.

In the surface layer 3 of the substrate 1 of this embodiment, there is further formed a p-type semiconductor guard ring region 15. The guard ring region 15 lies between the VDMOS 10 and the CMOS 30, and surrounds the VDMOS 10. The guard ring region 15 extends deeply and reaches the n+underlying layer 2 of the substrate 1.

The p-type guard ring region 15 is formed simultaneously by a diffusion step for forming the p-type Zener region 13. A shallower subregion 15a of the guard ring region 15 is formed by a diffusion step for forming the p-type channel region 4. A second Zener diode 16 is formed by a junction between the p type guard ring region 15 and the n+-type underlying layer 2 of the substrate 1. The Zener voltage of the second Zener diode 16 is equal to that of the first Zener diode 14. A p+-type semiconductor guard ring contact region 17 is formed in the guard ring region 15. The guard ring contact region 17 is in contact with a guard ring electrode 18 which is grounded.

FIG. 2 shows an equivalent circuit of the integrated device shown in FIG. 1, together with a load In FIG. 2, the VDMOS 10 is connected with a load 42 according to the source follower configuration shown in FIG. 10B.

Figure 3A:
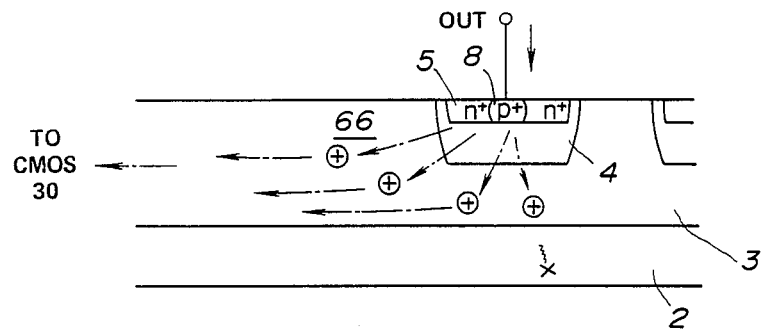
FIGS. 3A-3C are sectional views of portions of semiconductor devices for illustrating operations of the first embodiment.
Figure 3B:
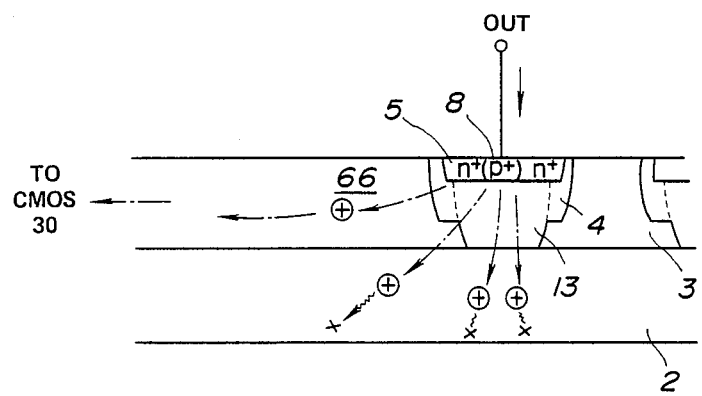
Figure 3C:
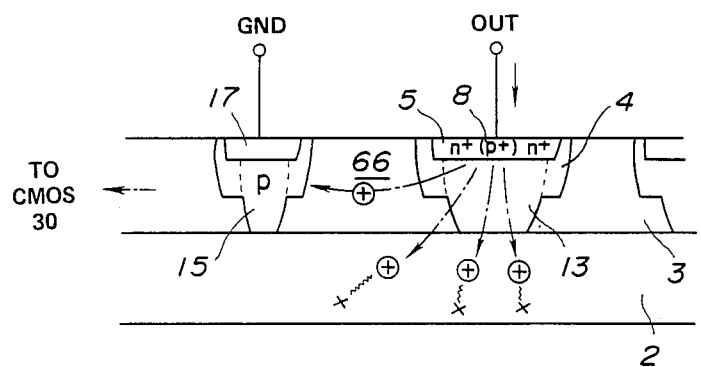

FIGS. 3A, 3B and 3C show the operations of the integrated device of FIG. 1 by comparison with the conventional device.

Figure 13:
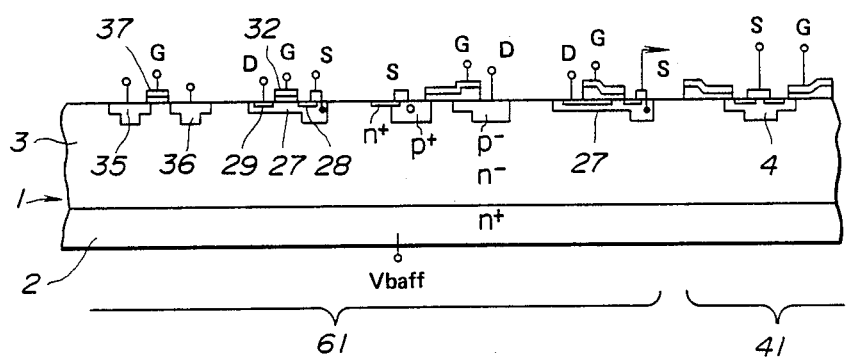
FIG. 13 is a vertical section showing an integrated circuit device of still another conventional type.
Figure 14:
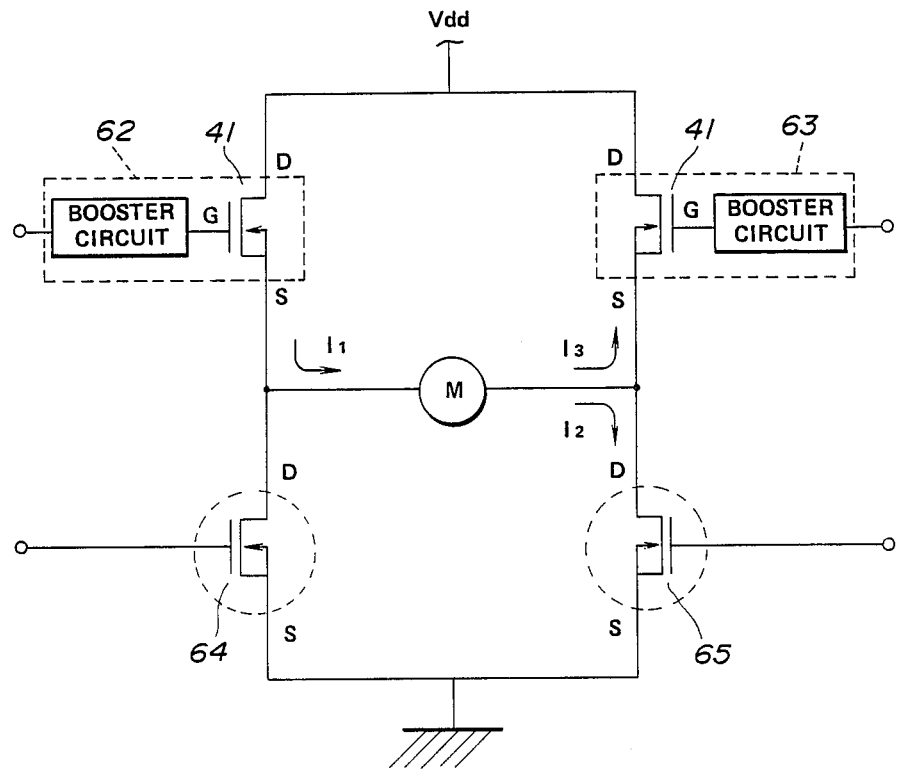
FIG. 14 is a diagram of a motor driving circuit using the power IC.
Figure 15:
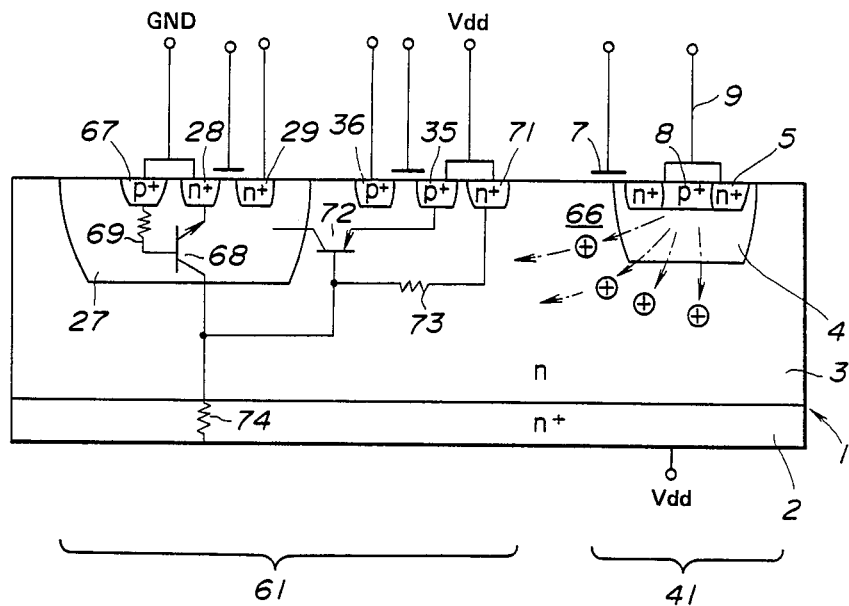
FIG. 15 is a vertical section of the conventional power IC for showing a latch-up of a CMOS.
Figure 16:
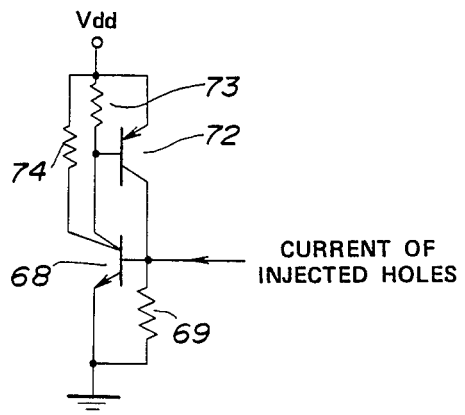
FIG. 16 is a diagram of an equivalent circuit of the structure shown in FIG. 15.

FIG. 3A shows the conventional device of FIG. 13. When a reverse current flows from the load, holes 66 are injected into the n-type epitaxial surface layer 3 and the n+underlying layer 2 as shown in FIG. 3A. In the conventional device of FIG. 3A, the injected holes 66 diffuse in the n-type surface layer 3, and easily reach the CMOS 30, so that the risk of latch-up of the CMOS is high as explained with reference to FIG. 15.

In the example of FIG. 3B having the Zener region 13 according to the present invention, most of the holes 66 are injected into the n+underlying layer 2 rather than into the n-type surface layer 3 for the following reasons. First, the actual shape of the p-type regions 4 and 13 has a wide bottom whose area is much greater than the area of its side surface. Furthermore, the distance from the p+channel contact region 8 to the side surface of the channel region 4 is great, and the resistance existing therebetween is high.

The n+underlying layer 2 has an electron concentration which is by far larger than that of the n-type surface layer 3. Therefore, the holes 66 injected into the n+underlying layer 2 readily recombine with the plentiful electrons, and disappear. In this way, the Zener region 13 of the present invention can sharply decrease the number of the holes reaching the CMOS 30 as compared with the conventional device, and reduce the risk of latch-up of the CMOS 30.

As shown in FIG. 3C, the guard region 15 prevents the holes 66 from reaching the CMOS 30 almost completely. Although the number of the holes injected into the n-type surface layer 3 is reduced by the Zener region 13, yet a part of the holes 66 flow into the n-type surface layer 3 and move toward the CMOS 30. However, these holes 66 are intercepted by the p-type guard ring region 15 intervening between the VDMOS 10 and the CMOS 30. The holes 66 are absorbed by the guard ring region 15, and flow out through the grounded guard ring electrode 8.

In order to achieve the above-mentioned effect, it is important to make a contact between the guard ring region 15 and the n+underlying layer 2. This requirement is accomplished in this embodiment by forming the p-type guard ring region 15, and the p-type Zener region 13 simultaneously by the same diffusion step without increasing the number of the steps of the fabrication process.

Figure 4:
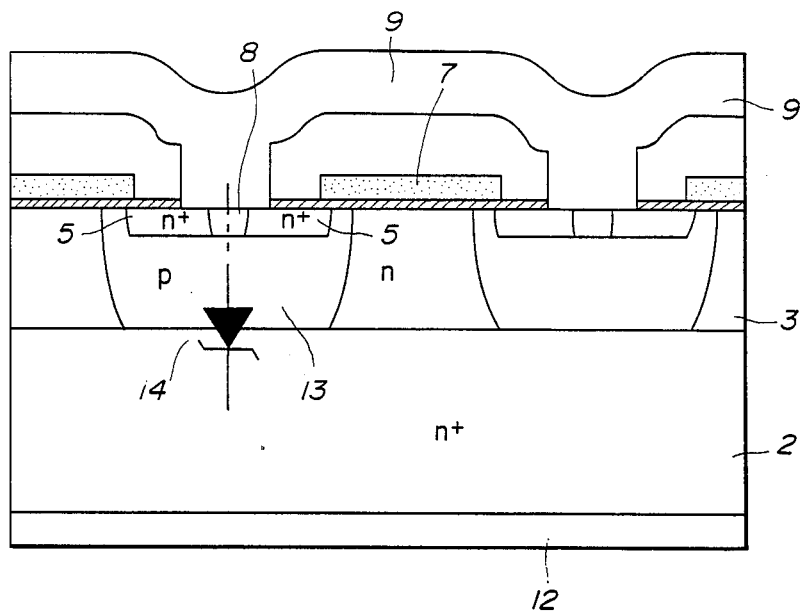
FIG. 4 is a sectional view of a portion of the device of the first embodiment for illustrating operations of a Zener diode.

The first Zener diode 14 formed in the VDMOS 10 further has a function of protecting the VDMOS against surge, as explained in the following with reference to FIGS. 4 and 5.

Figure 5:
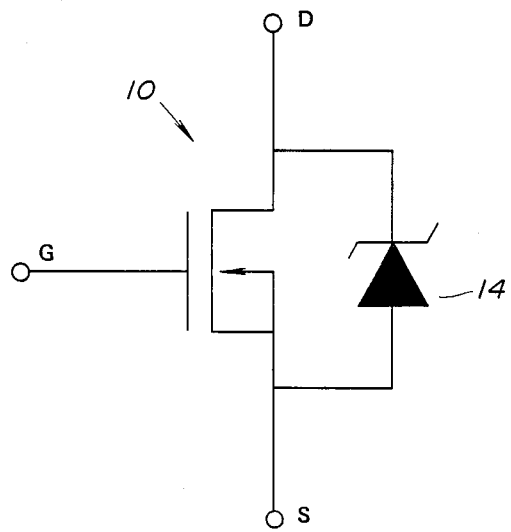
FIG. 5 is a diagram of an equivalent circuit of the structure shown in FIG. 4.

As shown in an equivalent circuit of FIG. 5, the Zener diode 14 is connected in parallel between the source and drain of the VDMOS 10. When the VDMOS 10 is used for switching an inductive load, a high voltage surge current flows between the drain and source of the VDMOS 10 at the time of turning off.

In the conventional device of FIG. 9, such a surge current tends to cause a breakdown to occur at or near portions 75 shown in FIG. 9. Accordingly, the current is concentrated at or near the portions 75, and the VDMOS 41 of the conventional type is readily damaged by heat in a relatively short time period.

In the VDMOS 10 of the present invention, the surge current always flows only through the Zener diode 14 whose Zener voltage is lower than the source-drain breakdown voltage of the VDMOS 10. The pn junction between the p-type Zener region 14 and the n+underlying layer 2 is broad and uniform, so that the Zener diode 14 is great in current capacity, and resistive to damage. That is, a sustaining energy is high.

The conventional VDMOS 41 is easily destroyed when the device is brought to a breakdown by application of a high surge voltage. Therefore, it is necessary to make the source-drain breakdown voltage of the conventional VDMOS 41 higher than the surge voltage (which is much higher than the supply voltage Vdd). However, the breakdown voltage of a MOS transistor is in a relationship of trade-off with its on resistance, so that the breakdown voltage cannot be increased without increasing the on resistance.

In the case of the VDMOS 10 according to the present invention, a high voltage surge is absorbed by the Zener diode 14. Therefore, the VDMOS 10 is not required to withstand the high voltage surge by itself, but it is only required to withstand the supply voltage. Thus, the Zener diode 14 of the present invention makes it possible to decrease the breakdown voltage of the VDMOS significantly. Therefore, the on resistance of the VDMOS 10 can be much lower than that of the conventional VDMOS 41, and it becomes possible to reduce the size of the device, and to fabricate the VDMOS at lower cost.

The structure of the first embodiment according to the present invention offers the following advantages. First, the Zener diode 14 of a large capacity formed between the source and drain of the VDMOS 10 eliminates the necessity for increasing the breakdown voltage of the VDMOS 10, so that the structure of the first embodiment can decrease the on resistance, the size of the device, and the fabrication cost of the VDMOS. Secondly, the p-type Zener region 13 of the first embodiment can sharply decrease the amount of the holes injected into the n-type surface layer 3, so that the structure of this embodiment can reduce the risk of latch-up of the CMOS 30 formed in the same substrate. Third, the p-type guard ring region 15 of this embodiment prevents the holes from passing therethrough, so that the structure of this embodiment can prevent a latch-up of the CMOS 30 almost completely. In this way, the first embodiment of the present invention can provide a power IC which can contain the CMOS 30 and the low on resistance VDMOS 10 within the same substrate without degrading their characteristics as compared with the discrete devices and without risk of latch-up, and which can be fabricated at lower cost.

Figure 6:
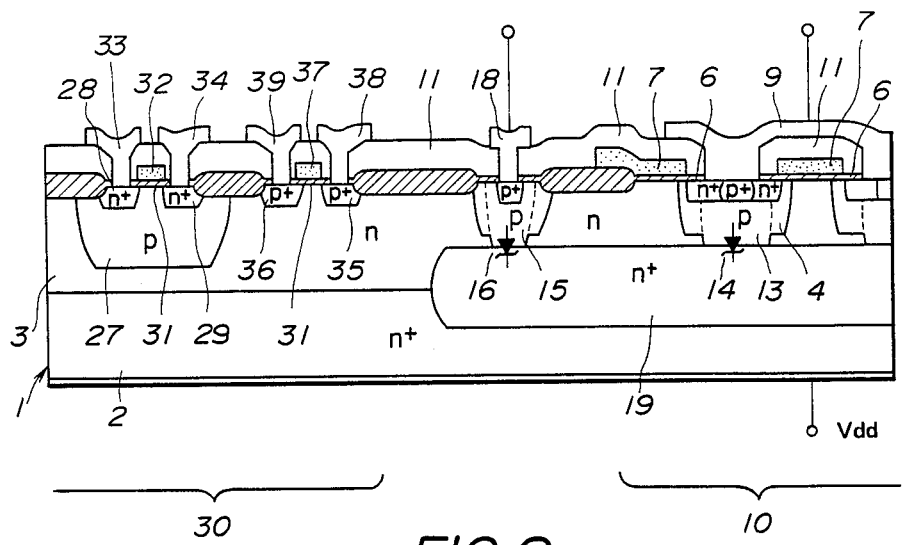
FIG. 6 is a vertical section showing a semiconductor device of a second embodiment according to the present invention.

A second embodiment of the present invention is shown in FIG. 6. The second embodiment is different from the first embodiment only in that the underlying layer of the substrate 1 is composed of an n+ bottom layer 2 and an n+ buried layer 19. The n+ -type buried layer 19 is formed between the n+ bottom layer 2 and the n surface layer 3 of the substrate 1. The $n+$ buried layer 19 of the second embodiment is formed only in an area in which the VDMOS 10 and the guard ring 15 are formed. The buried layer 19 is not formed in an area in which the CMOS 30 is formed. In this area, the n surface layer 3 is formed directly on the bottom layer 2.

While the n+ bottom layer 2 is formed by doping of antimony (Sb) impurity, the n+ buried layer 19 is formed by doping of phosphorus (P) impurity. The n+ buried layer 19 grows upwardly by diffusion during a heat treatment. The first and second Zener diodes 14 and 16 are formed, respectively, by a junction of the n+ buried layer 19 and the p Zener region 13, and a junction between the n+ buried layer 19 and the p guard ring region 15.

In order to decrease the Zener voltage of the Zener diodes 14 and 16 to a low value sufficient for practical use, it is necessary to make the impurity concentrations of the p Zener region 13 and the P guard ring region 15 sufficiently high, and at the same time to make the n surface layer 3 thin. However, decreasing the thickness of the n surface layer 3 in the area of the CMOS 30 is liable to degrade the withstanding capability of the CMOS 30 because the p island 27 formed in the n surface layer 3 becomes shallower, and the nMOS formed in the p island 27 becomes less resistant against punch-through breakdown.

On the other hand, the VDMOS 10 is exempt from the problem of punch-through because addition of the amount of the impurity of the p Zener region 13 to the amount of the impurity of the p channel region 4 makes the impurity concentration sufficiently high as compared with the p island 27.

In the second embodiment, therefore, the n surface layer 3 of the substrate 1 is made thin only in the area of the VDMOS 10 an the guard ring 15, and held thick enough in the area of the CMOS 30 by selectively forming the n+ buried layer 19.

The second embodiment of the present invention can increase the flexibility in design of power ICs by making it possible to determine the characteristics of the VDMOS 10 independent of the characteristics of the CMOS 30. A third embodiment of the present invention is shown in FIGS. 7 and 8A-8J. The third embodiment is similar to the second embodiment in that there is provided the n+ buried layer 19. However, the third embodiment is different from the second embodiment in that the impurity concentration of the n surface layer 3 of the substrate 1 is differentiated between the area of VDMOS 10 and the area of the CMOS 30.

Figure 7:
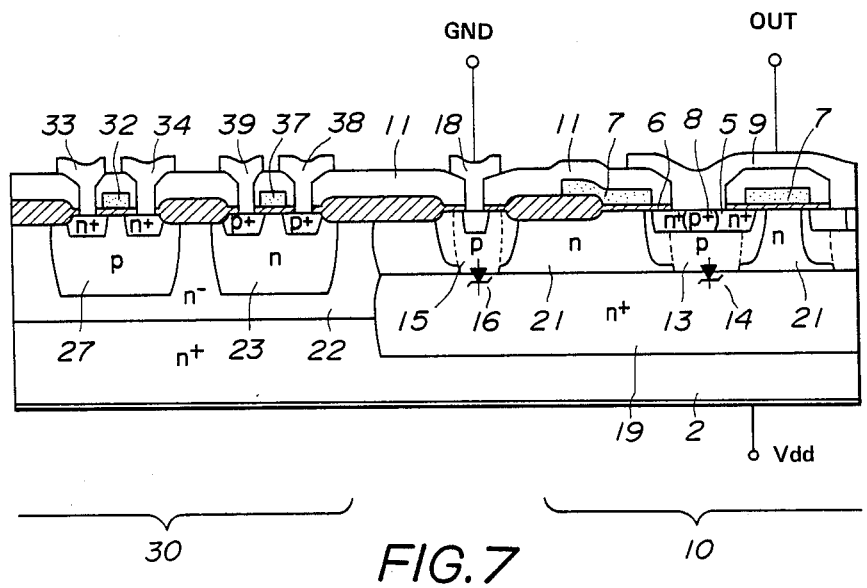
FIG. 7 is a vertical section showing a semiconductor device of a third embodiment.

As shown in FIG. 7, the surface layer of the substrate of the third embodiment is divided into an n-type region 21 and an n−-type region 22. The n region 21 is formed in the area in which the VDMOS 10 and the guard ring region 15 are formed. The n− region 22 is formed in the area in which the CMOS 30 is formed. An n-type island 23 is formed in the n− region 22, and the pMOS of the CMOS 30 is formed in the n island 23.

The structure of the third embodiment can further increase the flexibility in design of power ICs. Required characteristics such as threshold voltages are different between the VDMOS 10 and the CMOS 30. Besides, the threshold voltage of the CMOS 30 belonging to the planar type of MOS is determined differently from that of the VDMOS 10. In the third embodiment, it is possible to choose the impurity concentrations of the n region 21 and the n island 23 independent of each other so that the best conditions are attained for both of the VDMOS 10 and the CMOS 30.

FIGS. 8A-8J show one example of process for fabricating the device of the third embodiment.

Figure 8A:
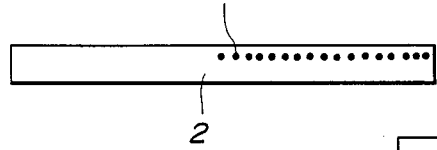
FIGS. 8A-8J are sectional views showing one example of a process for fabricating the device of the third embodiment.

FIG. 8A shows an ion implantation step for forming the n+ buried layer 19. At this step, phosphorus impurity (dose quantity $=1\times10^{16}$ cm$^{-2}$) is introduced by ion implantation into a predetermined portion of the n+ original substrate 2 (antimony concentration$=3\times10^{18}$cm$^{-3}$)

Figure 8B:
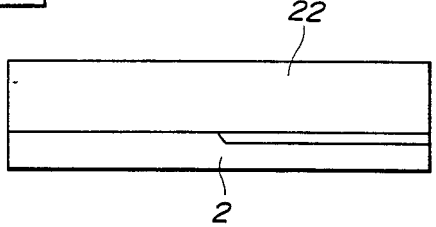
Figure 8C:
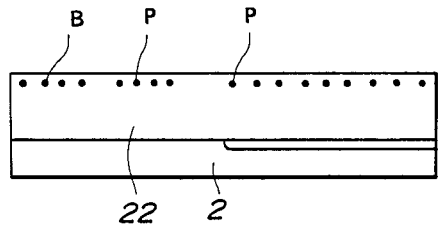
Figure 8D:
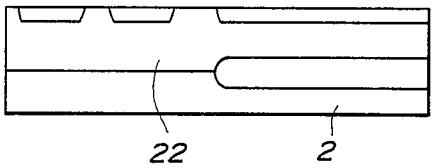

Then, as shown in FIG. 8B, the $n^{31}$ -type surface layer 22 is formed by epitaxial growth (phosphorus concentration $=1\times10^{15}$ cm$^{-3}$, epitaxial layer thickness $=18$ μm (micrometer)). At a next step of FIG. 8C, boron ions are implanted (dose quantity $=1\times10^{13}$ cm$^{-2}$) in an area to form the p island 7, phosphorus ions are implanted (dose quantity $=2\times10^{12}$ cm$^{-2}$) in an area to form the n island 23, and phosphorus ions are implanted (dose quantity $=6\times10^{12}$ cm$^{-2}$) in an area to form the n region 21. At a step of FIG. 8D, a first heat treatment (1200° C., 12 hours) is performed to form the p island 27, the n island 23, the n region 21 and the n buried layer 19.

Figure 8E:
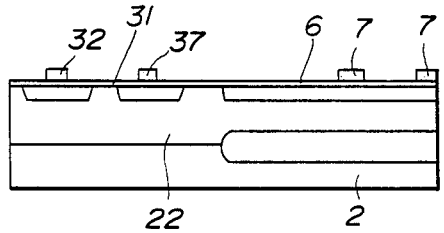

At a step of FIG. 8E. the gate insulating oxide layers 6 and 31 are formed. Then, the polycrystalline silicon gate electrodes 7, 32 and 37 are formed.

Figure 8F:
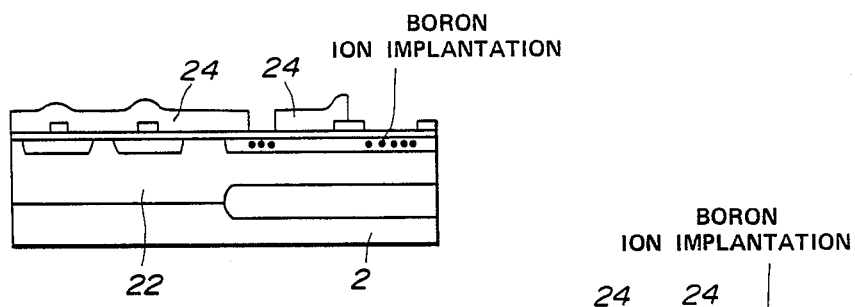

At a step of FIG. 8F, a photoresist layer 24 is selectively formed, and then, boron ions are implanted (dose quantity $=7\times10^{13}$ cm$^{-2}$) to form the p channel region 4, by using, as a mask, the photoresist layer 24, and a part of the polycrystalline silicon electrodes 7, 32 and 37.

Figure 8G:
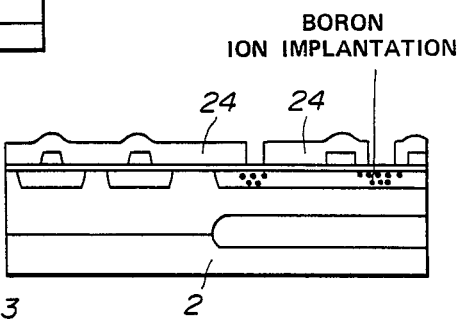
Figure 8H:
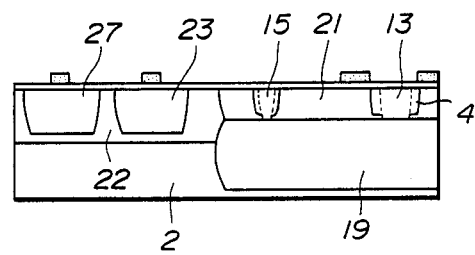

At a step of FIG. 8G the photoresist layer 24 is further formed in a predetermined area, and boron ions are implanted (dose quantity$=2\times10^{14}$ cm$^{-2}$) to the p Zener region 13 and the p guard ring region 15 by using, as a mask, the photoresist layer 24. At a step of FIG. 8H, the p channel region 4, the p Zener region 13 and the p guard ring region 15 are formed by a second heat treatment (1120° C., 24 hours). At the same time, the n+ buried layer 19 diffuses upwardly until the buried layer 19 comes into contact with the p Zener region 13 and the p guard ring region 15. The region 21, and the islands 23 and 27 are also grown and completed by diffusion during the second heat treatment.

Figure 8I:
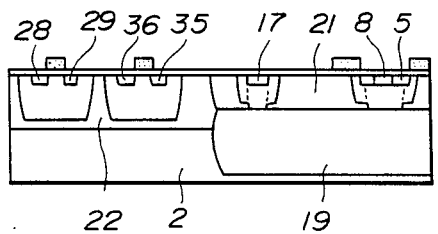

At a step of FIG. 8I, the n+ regions 5,28 and 29 and the p+ regions 8, 17, 35 and 36 are formed by ion implantation of phosphorus (dose quantity$=5\times10^{15}$ cm$^{31\ 2}$) and ion implantation of boron (dose quantity$=5\times10^{15}$ cm$^{-2}$), respectively, and a third heat treatment (1080° C., 40 minutes).

Figure 8J:
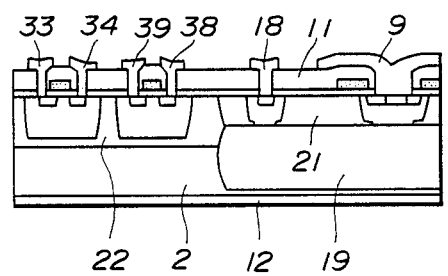

Finally, at a step of FIG. 8J, the intermediate insulating layer 11 is formed, and then contact holes are bored. Subsequently, the electrodes 9, 18, 33, 34, 38 and 39 and metal interconnection paths are formed by vacuum evaporation of Al and patterning. The Al electrode 12 is formed on the entirety of the bottom surface of the wafer. The final protective film (not shown) is formed on the entirety of the top surface of the integrated circuit chip, and then pad holes are bored.

The following list presents, as an example, characteristics of an integrated device of the third embodiment fabricated by the above-mentioned process under the above-mentioned conditions.

| VDMOS 10 | |
| --- | --- |
| Threshold Voltage | about 2.0 V |
| On Resistance (Vgs = 8 V) | about 0.3 ohm mm$^2$ |
| Zener Voltage | about 30 V |
| CMOS 30 | |
| Threshold Voltage (n-channel) | about 1.2 V |
| Threshold Voltage (p-channel) | about 1.2 V |

The present invention offers the following advantages.

In the present invention, the vertical MOS transistor is used in the source follower configuration, so that the vertical MOS transistor is easily isolated from other circuit components. Therefore, the present invention eliminates the necessity of isolation process which is troublesome and costly, and makes it possible to combine a CMOS which is complicated in structure, with the vertical MOS in the same substrate.

The structure of the present invention can prevent latch-up of CMOS, if it is formed on the same substrate, by decreasing or absorbing undesired carriers by the action of the channel region and the guad ring region, both reaching the highly doped layer.

The Zener diode of the present invention serves for regulating the drain breakdown voltage, so that the breakdown voltage of the vertical MOS itself need not be increased too much. Therefore, the present invention makes it possible to decrease the on resistance, and the cost of the device.

What is claimed is:

1. A semiconductor device comprising:
   a semiconductor substrate comprising a highly doped underlying layer of a first conductivity type and a lightly doped top layer of said first conductivity type formed on said underlying layer,
   a semiconductor channel region of a second conductivity type opposite to said first conductivity type, formed in said top layer of said substrate, said channel region being deep and joined with said highly doped underlying layer to form a first Zener diode,
   a semiconductor source region of said first conductivity type formed in said channel region to form a vertical MOS transistor with said channel region and said substrate which serves as a drain region,
   a separate group of semiconductor regions formed in said substrate to form another circuit component,
   a semiconductor guard ring region of said second conductivity type formed in said top layer of said substrate between said channel region of said MOS transistor and said separate group, said guard ring region extending deeply and reaching said highly doped underlying layer of said substrate,
   first means for applying a supply voltage to said drain region of said vertical MOS transistor,
   second means for connecting said source region to a load, and
   third means for grounding said guard ring region.

2. A semiconductor device according to claim 1 wherein said channel region comprises a deep Zener subregion reaching said highly doped underlying layer of said substrate, and a shallow peripheral subregion which surrounds said Zener subregion, and which is shallower than said deep Zener subregion, and wherein said device further comprises a highly doped channel contact region of said second conductivity type, surrounded by said source region, and located on top of said Zener subregion.

3. A semiconductor device according to claim 2 wherein said first means comprises a drain electrode formed on a bottom surface of said substrate, said second means comprises a topside source electrode, and said third means comprises a grounded guard ring electrode.

4. A semiconductor device according to claim 3 wherein said guard ring region comprises a deep central subregion formed by a step for forming said Zener subregion of said channel region, and a shallow peripheral subregion formed by a step for forming said shallow subregion of said channel region, said deep central subregion of said guard ring region being joined with said highly doped underlying layer of said substrate to form a second Zener diode having a Zener voltage substantially equal to a Zener voltage of said first Zener diode.

5. A semiconductor device according to claim 4 wherein said device further comprises a highly doped semiconductor first contact region of said second conductivity type, surrounded by said source region and put in contact with said source electrode, and a highly doped semiconductor second contact region of said second conductivity type, formed in said guard ring region and put in contact with said guard ring electrode.

6. A semiconductor device according to claim 5 wherein said device further comprises a gate electrode of polycrystalline silicon, formed above said peripheral subregion of said channel region, and separated from said channel region by a gate insulating layer.

7. A semiconductor device according to claim 6 wherein said separate group forms a CMOS, and comprises a first pair of source and drain semiconductor regions of said second conductivity type, formed in said top layer of said substrate, and a second pair of source and drain semiconductor regions of said first conductivity type, formed in a semiconductor island of said second conductivity type which is formed in said top layer of said substrate.

8. A semiconductor device according to claim 7 wherein said first conductivity type is an n-type, and said second conductivity type is a p-type.

9. A semiconductor device according to claim 1 wherein said underlying layer of said substrate comprises a highly doped bottom layer of said first conductivity type and a highly doped buried layer of said first conductivity type which is formed between said bottom layer and said top layer in a first area of said substrate in which said channel region and said guard ring region are formed, and said separate group is formed in a second area of said substrate in which said top layer is formed directly on said bottom layer.

10. A semiconductor device according to claim 9 wherein a thickness of said top layer is smaller in said first area than in said second area.

11. A semiconductor device according to claim 10 wherein said channel region is joined with said buried layer to form said first Zener diode, and said guard ring region is joined with said buried layer to form a second Zener diode.

12. A semiconductor device according to claim 11 wherein said separate group forms a CMOS in said second area.

13. A semiconductor device according to claim 10 wherein said top layer comprises a first part in which said channel region and said guard ring region are formed, and a second part in which said separate group is formed, an impurity concentration of said first part of said top layer being different from an impurity concentration of said second part.

14. A semiconductor device according to claim 13 wherein said impurity concentration of said first part of said top layer is higher than said impurity concentration of said second part.

15. A semiconductor device according to claim 14 wherein said separate group forms a CMOS, and comprises a first pair of source and drain semiconductor regions of said first conductivity type, formed in a first semiconductor island of said second conductivity type which is formed in said second part of said top layer, and a second pair of source and drain semiconductor regions of said second conductivity type formed in a second semiconductor island of said first conductivity type which is formed in said second part of said top layer and which has an impurity concentration higher than said impurity concentration of said second part of said top layer.

* * * * *